(12) United States Patent
Tavkhelidze et al.

(10) Patent No.: US 8,227,885 B2
(45) Date of Patent: Jul. 24, 2012

(54) SELECTIVE LIGHT ABSORBING SEMICONDUCTOR SURFACE

(75) Inventors: Avto Tavkhelidze, Tbilisi (GE); Amiran Bibilashvili, Tbilisi (GE); Zaza Taliashvili, Tbilisi (GE)

(73) Assignee: Borealis Technical Limited (GI)

( * ) Notice: Subject to any disclaimer, the term of this patent is extended or adjusted under 35 U.S.C. 154(b) by 625 days.

(21) Appl. No.: 11/825,558

(22) Filed: Jul. 5, 2007

(65) Prior Publication Data

US 2008/0066797 A1 Mar. 20, 2008

(30) Foreign Application Priority Data

Jul. 5, 2006 (GB) .................................. 0613277.3
Sep. 28, 2006 (GB) .................................. 0619085.4

(51) Int. Cl.
*H01L 33/50* (2010.01)

(52) U.S. Cl. ........ 257/436; 257/431; 257/432; 257/461; 257/E31.038; 257/E31.127; 136/249; 136/256; 136/257; 136/261; 136/262

(58) Field of Classification Search .................... 257/14, 257/22, 103, E25.007, E25.009, E27.124, 257/E27.125, E27.126, 431, 432, 436, 461, 257/E31.038, E31.127, E31.13; 136/200, 136/206, 256, 249, 257, 261, 262
See application file for complete search history.

(56) References Cited

U.S. PATENT DOCUMENTS

| | | | |
|---|---|---|---|
| 3,740,592 A | 6/1973 | Engdahl et al. | |
| 4,011,582 A | 3/1977 | Cline et al. | |
| 4,039,352 A | 8/1977 | Marinescu | |
| 4,063,965 A | 12/1977 | Cline et al. | |
| 4,686,162 A | 8/1987 | Stangl et al. | |
| 5,023,671 A | 6/1991 | DiVincenzo et al. | |
| 5,068,535 A | 11/1991 | Rabalais | |
| 5,119,151 A | 6/1992 | Onda | |

(Continued)

FOREIGN PATENT DOCUMENTS

DE 3404137 A1 8/1985

(Continued)

OTHER PUBLICATIONS

Oxford English Dictionary online, Second Edition, 1989.*

(Continued)

*Primary Examiner* — Evan Pert
*Assistant Examiner* — Eduardo A Rodela

(57) ABSTRACT

A selective light absorbing semiconductor surface is disclosed. Said semiconductor surface is characterized by the presence of indentations or protrusions comprising a grating of dimensions such as to enhance the absorption of selected frequencies of radiation. In a preferred embodiment of the present invention, said grating is formed on the surface of a doped semiconductor for the purposes of optical frequency down conversion. The semiconductor is doped so as to create energy levels within the forbidden zone between the conduction and valence bands. Incident radiation excites electrons from the valence to conduction band from where they decay to the meta-stable newly created energy level in the forbidden zone. From there, electrons return to the valence band, accompanied by the emission of radiation of lower frequency than that of the incident radiation. Optical frequency downconversion is thus efficiently and rapidly accomplished. In a further embodiment of the present invention said grating is formed on the entrance and exit surfaces of one or more layers of a single or multi-junction solar cell. In this embodiment said grating is characterized by indents of depth $\lambda/4$ and width $>\lambda$, where $\lambda$ is the wavelength of solar radiation incident on the layer under consideration.

17 Claims, 3 Drawing Sheets

U.S. PATENT DOCUMENTS

| | | | |
|---|---|---|---|
| 5,229,320 | A | 7/1993 | Ugajin |
| 5,233,205 | A | 8/1993 | Usagawa et al. |
| 5,247,223 | A | 9/1993 | Mori et al. |
| 5,332,952 | A | 7/1994 | Ugajin et al. |
| 5,336,547 | A | 8/1994 | Kawakita et al. |
| 5,371,388 | A | 12/1994 | Oda |
| 5,432,362 | A | 7/1995 | Lippens et al. |
| 5,503,963 | A | 4/1996 | Bifano |
| 5,521,735 | A | 5/1996 | Shimizu et al. |
| 5,579,232 | A | 11/1996 | Tong et al. |
| 5,604,357 | A | 2/1997 | Hori |
| 5,654,557 | A | 8/1997 | Taneya et al. |
| 5,675,972 | A | 10/1997 | Edelson |
| 5,699,668 | A | 12/1997 | Cox |
| 5,705,321 | A | 1/1998 | Brueck et al. |
| 5,719,407 | A | 2/1998 | Ugajin |
| 5,722,242 | A | 3/1998 | Edelson |
| 5,772,905 | A | 6/1998 | Chou |
| 5,917,156 | A | 6/1999 | Nobori et al. |
| 6,117,344 | A | 9/2000 | Cox et al. |
| 6,214,651 | B1 | 4/2001 | Cox |
| 6,225,205 | B1 | 5/2001 | Kinoshita |
| 6,281,514 | B1 | 8/2001 | Tavkhelidze |
| 6,309,580 | B1 | 10/2001 | Chou |
| 6,417,060 | B2 | 7/2002 | Tavkhelidze et al. |
| 6,495,843 | B1 | 12/2002 | Tavkhelidze |
| 6,531,703 | B1 * | 3/2003 | Tavkhelidze ............... 250/493.1 |
| 6,680,214 | B1 | 1/2004 | Tavkhelidze et al. |
| 6,858,462 | B2 * | 2/2005 | Zaidi et al. ...................... 438/71 |
| 6,914,312 | B2 | 7/2005 | Nishikawa et al. |
| 6,919,605 | B2 | 7/2005 | Tigelaar |
| 6,919,608 | B2 | 7/2005 | Gregg |
| 7,074,498 | B2 | 7/2006 | Tavkhelidze et al. |
| 7,166,786 | B2 | 1/2007 | Tavkhelidze et al. |
| 2001/0046749 | A1 | 11/2001 | Tavkhelidze et al. |
| 2003/0068431 | A1 | 4/2003 | Taliashvili et al. |
| 2003/0221608 | A1 | 12/2003 | Mori |
| 2004/0174596 | A1 | 9/2004 | Umeki |
| 2005/0242364 | A1 * | 11/2005 | Moustakas et al. ........... 257/103 |
| 2008/0078444 | A1 * | 4/2008 | Atanackovic ................. 136/256 |
| 2011/0215231 | A1 * | 9/2011 | Fattal et al. ............... 250/237 R |

FOREIGN PATENT DOCUMENTS

| | | |
|---|---|---|
| DE | 3818192 A1 | 12/1989 |
| EP | 0437654 A1 | 7/1991 |
| JP | 03155376 A | 7/1991 |
| JP | 404080964 A | 3/1992 |
| JP | 05226704 A | 9/1993 |
| WO | WO-99/13562 A1 | 3/1999 |
| WO | WO-99/64642 A1 | 12/1999 |
| WO | WO-00/59047 A | 10/2000 |
| WO | WO-02/47178 A | 6/2002 |
| WO | WO-03/083177 A3 | 10/2003 |
| WO | WO-2004/040617 A2 | 5/2004 |

OTHER PUBLICATIONS

Chou et al., "Imprint Lithography with 25 Nanometer Resolution", SCIENCE, Apr. 5, 1996, pp. 85-87, vol. 272.

Sungtaek Ju et al., "Study of interface effects in thermoelectric microfefrigerators", Journal of Applied Physics, Oct. 1, 2000, pp. 4135-4139, vol. 88, No. 7.

Hishinuma et al., "Refrigeration by combined tunneling and thermionic emmission in vacuum: Use of nanometer scale design", Appl Phys Lett, Apr. 23, 2001, pp. 2572-2574, vol. 78, No. 17.

Leon N. Cooper, "Bound Electron Pairs in Degenerate Fermi Gas", Physical Review, Nov. 15, 1956, pp. 1189-1190, vol. 104, No. 4.

Bardeen et al., "Theory of Superconductivity", Physical Review, Dec. 1, 1957, pp. 1175-1204, vol. 108, No. 5.

Tavkhelidze et. al, "Observation of quantum interference effect in solids", Journal of Vacuum Science & Technology B: Microelectronics and Nanometer Structures, May 12, 2006.

Tavkhelidze et. al, "Observation of New Quantum Interference Effect in Solids", Vacuum Nanoelectronics Conference, 2005. IVNC 2005. Technical Digest of the 18th International.

* cited by examiner

12 ——————— $E_c$

13 ——————— $E$

11 ——————— $E_v$

SELECTIVE LIGHT ABSORBING SEMICONDUCTOR SURFACE

CROSS-REFERENCE TO RELATED APPLICATIONS

This application claims the benefit of GB Patent App. No. GB0613277.3, filed Jul. 5, 2006, and GB Patent App. No. GB0619085.4, filed Sep. 28, 2006.

BACKGROUND OF THE INVENTION

This invention relates to selective light absorbing surfaces or gratings.

U.S. Pat. Nos. 6,281,514, 6,495,843, and 6,531,703 disclose methods for promoting the passage of electrons at or through a potential barrier comprising providing a potential barrier having a geometrical shape for causing quantum interference of electron de Broglie wave. Also provided is an electron-emitting surface having a series of indents, the depth of which is chosen so that the probability wave of the electron reflected from the bottom of the indent interferes destructively with the probability wave of the electron reflected from the surface. This results in the increase of tunneling through the potential barrier. A further embodiment provides a method for making an electron-emitting surface having a series of indents.

U.S. Pat. Nos. 6,680,214 and 7,166,786 disclose methods for the induction of a suitable band gap and electron emissive properties into a substance, in which the substrate is provided with a surface structure corresponding to the interference of de Broglie waves.

WO99/064642 discloses a method for fabricating nanostructures directly in a material film, preferably a metal film, deposited on a substrate.

WO04/040617 discloses a method that blocks movement of low energy electrons through a thermoelectric material. This is achieved using a filter that is more transparent to high-energy electrons than to low energy ones. The geometry of the filter is such that it becomes transparent for electrons having certain de Broglie wavelength. If the geometry of the filter is such that its transparency wavelength matches the wavelength of high-energy electrons it will be transparent for high-energy electrons whilst blocking low energy electrons.

Semiconductors are characterized by the presence of an energy gap between the occupied valence band and largely empty conduction band. This energy gap is a forbidden zone within which electrons cannot exist. Incident radiation with photon energy greater than the energy gap is absorbed by electrons in the valence band. These electrons are excited to the conduction band, leaving behind a positively charged ion, known as a hole, in the valence band.

Doping of a semiconductor allows the existence of energy levels, and therefore electrons, within the forbidden zone. The exact location of these energy levels depends on the dopant and its concentration. Doping with electron donors (n-type doping) produces energy levels close to the conduction band whereas doping with hole donors (p-type doping) produces energy levels closer to the valence band. These energy levels, when occupied, have a relatively long lifetime and electrons can therefore accumulate in these energy levels.

The semiconductor properties described above can be better understood with reference to FIG. 1. Shown is a doped semiconductor within which we have bottom of conduction band 12, energy level 13 created in the previously forbidden zone and top of valence band 11. Incoming radiation with energy greater than or equal to the energy gap between levels 11 and 12 excites electrons from valence band to conduction band. These electrons then descend via thermal or irradiative losses to energy level 13 where they accumulate due to the relative stability of energy level 13. When electrons drop from energy level 13 back to top of valence band 11, they recombine with holes and a photon with energy equal to the energy gap between levels 13 and 11 is emitted.

Clearly, the frequency of the emitted radiation is lower than the frequency of the incident radiation.

Solar cell technology is based on the semiconductor p-n junction. Light is absorbed in the semiconductor causing transition of electrons from the valence band of the semiconductor to the conduction band, as shown in FIG. 2. The relationship between the energy of the photon, hv, and the gap width in the energy spectrum of the semiconductor, Eg, defines the mechanism of photon absorption. In the case where hv<Eg, the photon is not absorbed inside the semiconductor and the semiconductor layer appears to be transparent for light of that wavelength. In the case where hv=Eg, the photon causes transition of electrons from the valence band to the conduction band. Those electrons are collected by another electrode and their energy is converted into electric energy (not shown in FIG. 2). In the case when hv>Eg, the photon will excite the electron from the valence band to conduction band with excess of kinetic energy $E_h$. This electron will fall back to the bottom of conduction band releasing excess energy as heat in light collecting electrode. In the last case some of the energy of the incoming photon is converted to heat instead of electricity reducing the efficiency of the device.

The semiconductor layer is thus only converting photon energy efficiently in the narrow band of photon energies of incoming light (when hv~Eg). To solve this problem multi-stage energy conversion has been used, as shown in FIG. 3, in which the device comprises many layers placed in series normal to the incoming light. Each layer comprises a p-n junction and is electrically connected in series. The first layer has the widest energy gap in the spectrum. It absorbs photons having energy $hv_1$ and is transparent for photons having lower energies $hv_2$, $hv_2<hv_1$. The next layer absorbs photons having energy $hv_2$ and is transparent for photons having energy $hv_3<hv_2$ and so on. It is thus clear that each layer and the device as a whole will be most efficient if each layer absorbs only its characteristic frequency $v_1=Eg_1/h$.

BRIEF SUMMARY OF THE INVENTION

The present invention discloses a grating suitable for implementation on a surface of a material. The grating comprises a series of indents or protrusions of dimensions such that interference effects are created which allow electromagnetic radiation of only a certain frequency v to pass into the material without reflection at the surface.

In a particularly preferred embodiment of the present invention, the above described frequency reduction mechanism in doped semiconductors is utilized by combining a suitable semiconductor material with a grating surface to produce an optical frequency down converter. The semiconductor is chosen such that $E_v$ (energy of valence band)$-E_c$ (energy of conduction band) is equal to or smaller than hv, and is doped with materials that create appropriate energy levels within the forbidden zone, such that the frequency of radiation emitted is $(E'-E_v)/h$ where E' is the energy of the energy level created in the forbidden zone.

An advantage of this embodiment of the present invention is that an optical frequency down conversion is accomplished using a simple and inexpensive system comprising as its active element only a doped semiconductor with surface grating.

A further advantage of this embodiment of the present invention is that the energy of the new energy level created in the forbidden zone is controlled by the type and concentration of donor injected into the semiconductor. This allows the position of the energy level to be varied at manufacture, in order to achieve a particularly desired frequency shift.

Yet a further advantage of this embodiment of the present invention concerns its conversion efficiency. Conversion efficiencies depend on the various probabilities of decay from each energy level. In the current invention, the energy level created in the forbidden zone is meta-stable with a relatively long lifetime compared to the lifetime of electrons in the conduction band. The probability of electron decay from the conduction to valence band is thus considerably lower than the probability of decay from the new energy level to valence band, thereby ensuring that the frequency conversion process is an efficient one.

A further advantage of this embodiment of the present invention is that the frequency conversion is almost instantaneous. The rate of conversion is limited only by the lifetime of the various electron energy levels involved. The present invention is thus able to meet the most rigorous demands in terms of rapid frequency conversion and can also be used for the conversion of very short pulses.

A further advantage of the present invention is that by generating optical signals, each with a unique carefully defined frequency and offset, it is possible to transmit over a single-mode optical fiber a number of closely spaced channels. The potential efficiency of optical fibres used in optical communications is thus greatly enhanced.

In another preferred embodiment of the present invention, a grating is formed on the entrance and exit surfaces of one or more layers of a multi-junction solar cell.

An advantage of this embodiment of the present invention is that the selectivity and transparency of each layer is improved, thereby enhancing the overall efficiency of the solar cell.

Still further advantages of the present invention and its various embodiments will become apparent from a consideration of the ensuing description and drawings.

BRIEF DESCRIPTION OF THE SEVERAL VIEWS OF THE DRAWING

For a more complete explanation of the present invention and the technical advantages thereof, reference is now made to the following description and the accompanying drawing in which.

DETAILED DESCRIPTION OF THE INVENTION

Figure 4:
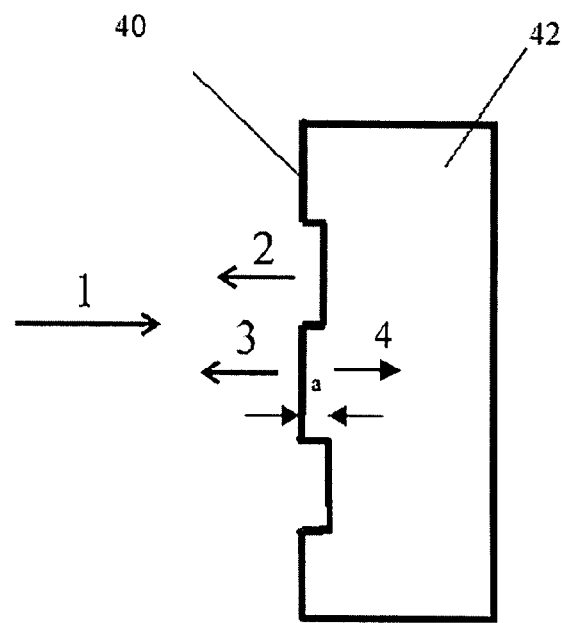
FIG. 4 shows a schematic of a semiconductor material having a grating on one surface, capable of acting as an optical frequency down converter.
Figure 5:
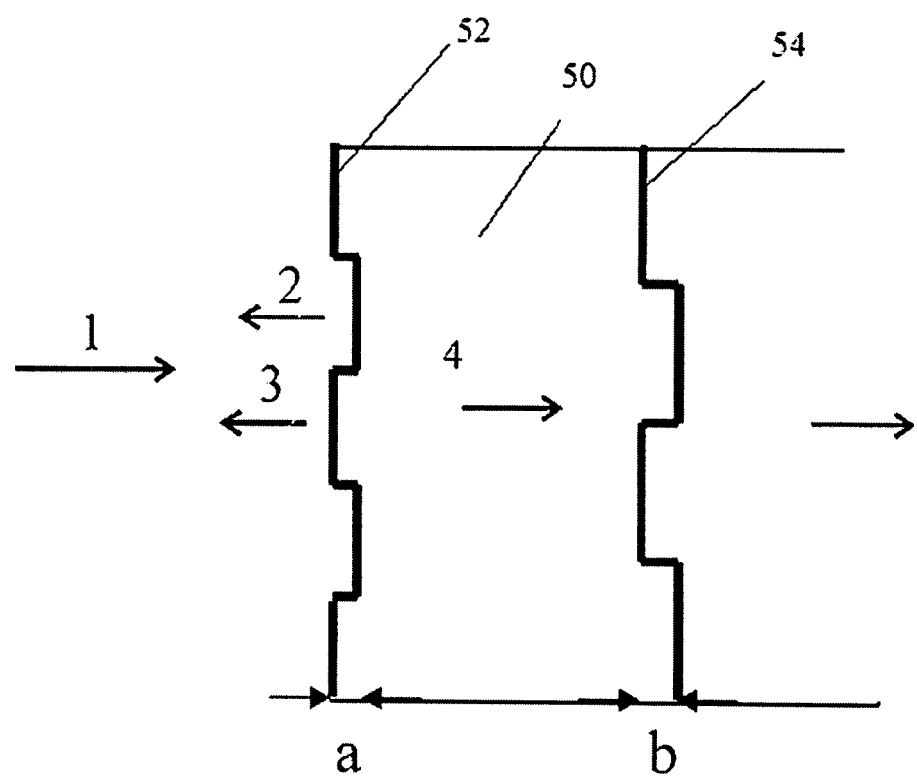
FIG. 5 shows a schematic of two gratings, one on each surface of a semiconductor, capable of acting as an enhanced efficiency layer in a solar cell.

Embodiments of the present invention and their technical advantages may be best understood by referring to FIGS. 4 and 5. The present invention relates to a grating on the surface of a semiconductor with selective light absorbing properties. Such a semiconductor selective light-absorbing grating has a variety of applications. In particular, it is capable of acting as an optical frequency down converter and can also be incorporated into a multijunction solar cell.

The function of the grating may be better understood with reference to FIG. 4, which shows the semiconductor grating of the present invention in diagrammatic form. Grating 40, which is formed on the surface of semiconductor material 42, is characterized by periodic indentations or protrusions. The depth of periodic indentations (equivalent to the height of periodic protrusions) is equal to a, as denoted in FIG. 4.

Methods for the imprinting of such indents on a semiconductor surface are well known to those skilled in the art and include screen printing, as used for printing CD surfaces, electron beam lithography and other imprinting processes.

Consider electromagnetic wave 1 as it meets periodic indents on grating 40. Part of electromagnetic wave 1 is reflected back from the top of an indent as wave 2 and an equal part is reflected from the bottom of an indent as wave 3. The interference of reflected waves 2 and 3 depends on the path length difference between them. The path length difference is in turn determined by indent height a, and is in fact equal to 2a since this is the difference in distance traveled by waves 2 and 3.

In the case where reflected waves 2 and 3 are in anti phase they will interfere destructively and cancel each other out completely. In order for such destructive interference to occur the difference in path length 2a must be equal to $$2a = \lambda/2 + n\lambda \qquad (1)$$

where $\lambda$ is the wavelength of electromagnetic wave 1 and n is an integer greater than or equal to 0. Such a wave will therefore not reflect, and will pass through the grating.

The relationship between electromagnetic wave velocity, frequency and wavelength is given by $$\lambda = c/\nu \qquad (2)$$

where c is the velocity of light. From this it is clear that if we choose the depth of the indent to be $$a = c/4\nu \qquad (3)$$

then radiation having characteristic frequency $\nu$ will not be reflected back from grating 40 and will fully penetrate into semiconductor 42.

In a particularly preferred embodiment of the present invention the grating of the present invention is formed on the surface of a doped semiconductor to produce an optical frequency down converter. Referring again to FIG. 4, semiconductor 42 is chosen to be a doped semiconductor. Incident radiation wave 1 with energy h$\nu$ approaches grating 40. Semiconductor 42 is doped such that $E_v - E_c$, the energy gap between conduction and valence bands, is equal to or smaller than energy h$\nu$ of incident radiation wave 1. Semiconductor 42 is doped with materials that create appropriate energy levels within the forbidden zone, such that the frequency of radiation emitted is $(E' - E_v)/h$ where E' is the energy of the newly created energy level in the forbidden zone. Grating 40 comprises a series of indents and protrusions giving the surface a corrugated pattern of squared off "u"-shaped ridges and or valleys. Interference effects allow electromagnetic radiation of a certain frequency ν to pass into semiconductor material 42 without reflection from the surface.

In one embodiment of the present invention semiconductor material 42 comprises a direct band gap semiconductor, such as gallium arsenide.

In another embodiment of the present invention semiconductor material 42 is doped with electron donors (n-type doping) so as to create energy levels close to the conduction band. This produces a relatively large gap between the created energy level and the valence band, thereby leading to the output of higher frequency light.

In another embodiment of the present invention semiconductor material 42 is doped with hole donors (p-type doping) so as to create energy levels close to the valence band. This produces a relatively small gap between the created energy level and the valence band, thereby leading to the output of lower frequency light.

In a yet a further embodiment of the present invention the type and concentration of doping is controlled so as to tailor the position of the created energy level to output light of a specific desired frequency.

When electromagnetic radiation enters semiconductor 42 it excites electrons from the valence band to the conduction band, from where electrons jump down to energy level E' radiating photons of energy $E_c-E'$ in the process.

Further, these electrons then return to the valence band, emitting photons of frequency ν' which is at a lower frequency than the frequency of the incoming, exciting photons. This is shown on FIG. 4 as radiation wave 4.

The presence of the grating on one surface of a semiconductor lends itself to application as an optical frequency down converter. However, there exists a further embodiment of the present invention in which the semiconductor has a grating on each surface and this has entirely different applications. The latter embodiment of the present invention can best be understood by referring to FIG. 5, which is a schematic diagram of two gratings, one on each surface of a semiconductor. Shown is semiconductor 50 with entrance surface grating 52 and exit surface grating 54. Indents of depths a and b respectively characterize entrance and exit surface gratings 52 and 54 of semiconductor 50.

Consider electromagnetic wave 1 as it meets entrance surface grating 52. As described above in relation to FIG. 4, part of electromagnetic wave 1 is reflected back from the top of an indent as wave 2 and an equal part is reflected from the bottom of an indent as wave 3. A third portion of electromagnetic wave 1 will not be reflected and will fully penetrate into semiconductor 50 as wave 4. Let c' be the speed of wave 4 inside semiconductor 40 and ν' its frequency.

Now consider the behavior of wave 4 as it meets exit surface grating 54 with indents of depth b.

In a preferred embodiment of the current invention, the depth of indents b is given by $$b=c'/4\nu' \quad (4)$$

As described above, wave 4, possessing this characteristic frequency ν', is not reflected back inside semiconductor 50 and passes through exit surface grating 54.

According to this embodiment of the present invention, incident light of a first frequency ν passes into semiconductor 50 through entrance surface grating 52 and emitted light of a second frequency ν' passes out through the opposite surface, namely exit surface grating 54.

One application of this embodiment of the present invention is as a coating for glasses, lenses or other optical parts. An observer looking through the optical part would see radiation in its frequency-converted form. For example, ultraviolet radiation could be seen as visible, say blue light.

Figures 1, 2:
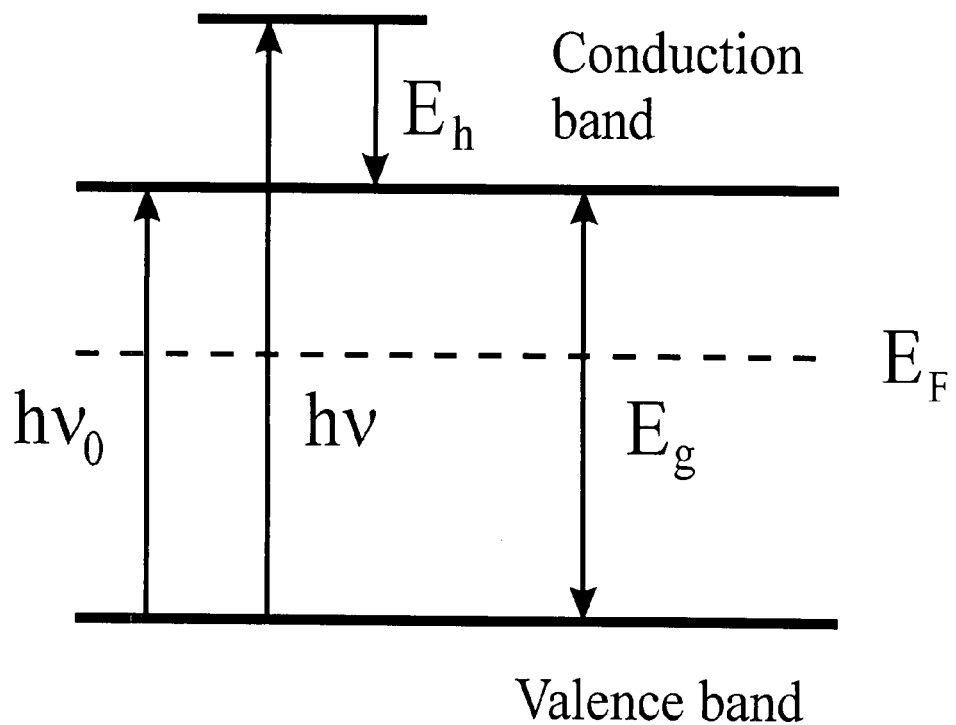
FIG. 1 shows an energy diagram for a doped semiconductor.
FIG. 2 shows energy diagram of a prior art semiconductor p-n junction in which light is absorbed causing transition of electrons from the valence band of the semiconductor to the conduction band.
Figure 3:
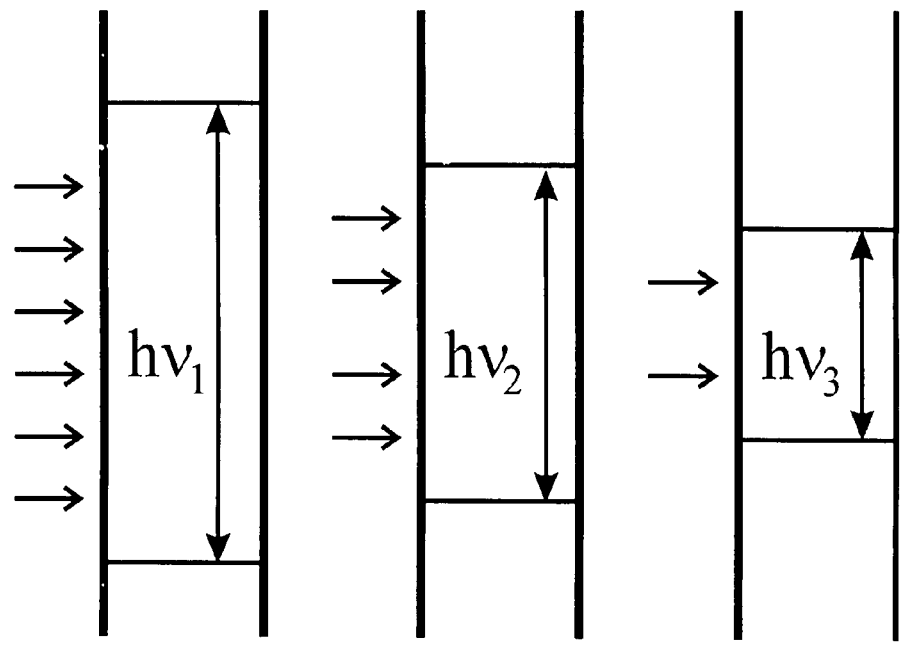
FIG. 3 shows a prior art multi-junction solar cell comprising many layers placed in series normal to the incoming radiation.

In a further particularly preferred embodiment of the present invention a grating is formed on the entrance and exit surfaces of layers in a multijunction solar cell, thereby improving its energy conversion performance. This embodiment of the present invention can be understood by again referring to FIG. 5 in the context of a multi-junction solar cell, where semiconductor 50, entrance surface grating 52 and exit surface grating 54 together constitute one layer of said multi-junction solar cell, such as in the example shown in FIG. 3.

Consider a ray of electromagnetic radiation 1 having a wide spectrum. Periodic indents on entrance surface grating 52 reflect back some part of the radiation. If we choose the depth of the indents of entrance surface grating 52 to be $a=c/4\nu_1$, as above, then radiation having characteristic frequency $\nu_1$ of said layer will not be reflected back from entrance surface grating 52 of said layer. This radiation will fully penetrate inside said layer where it will be most efficiently absorbed and converted to electricity. The efficiency of light absorption in said layer is thus increased.

Furthermore, in the case where exit surface grating 54 is characterized by indents of depth $b=c'/4\nu_2$, as described above, radiation having characteristic frequency $\nu_2$ of a second layer will not be reflected back and will be fully available for the efficient absorption in said second layer.

The structure described above is clearly applicable to further layers, thereby yielding an improved efficiency multi-junction solar cell. Obviously, the operation of a conventional single layer solar cell can also be improved using this method.

Solar radiation is centered at around 500 nm. The value of a is set at ¼ of this wavelength or 125 nm. The width of said indents must be greater than the wavelength (c/ν) of the incident light in order to avoid diffraction effects. In a preferred embodiment of the present invention, the width of said indents should be no less than 500 nm and preferably 2-5 microns. Indents of such dimensions may be easily fabricated using conventional photolithography.

Although the description above contains many specificities, these should not be construed as limiting the scope of the present invention but as merely providing illustrations of some of the presently preferred embodiments of the invention. Thus the scope of the present invention should be determined by the appended claims and their legal equivalents, rather than by the examples.

The invention claimed is:

1. A solar cell for converting light to electricity and comprising a grating formed on an entrance surface of a solar cell material, said grating allowing passage of incident light of frequency ν and a wavelength c/ν centered around 500 nm;

said grating comprising a surface having one or more squared-off "u"-shaped indents having a depth substantially equal to c/4ν and a width greater than the wavelength of the incident light, where c is the speed of light, whereby said light reflected from a top of said indents interferes destructively with said light reflected from a bottom of said indents and light with a frequency less than ν passes through the grating.

2. The solar cell of claim 1 wherein said solar cell material comprises a doped semiconductor having a band gap energy Eg equal to or smaller than an energy hν of said incident light, where h is the Planck constant.

3. The solar cell of claim 2, wherein said semiconductor is doped to output light of a specific desired frequency.

4. The solar cell of claim 1 having a second grating different from said grating on said entrance surface formed on an exit surface of said solar cell material.

5. The solar cell of claim 4 wherein said second grating is further characterized by indentations or protrusions of depth substantially equal to $c'/4v'$ where $c'$ is the speed of light in said material and whereby passage of incident light of frequency $v'$ is allowed.

6. The solar cell of claim 5, further including one or more additional of said solar cells positioned so that light of said frequency $v'$ of said solar cell is incident to an entrance surface of said additional solar cell.

7. The solar cell of claim 4 wherein said solar cell material comprises a doped semiconductor selected to enhance absorption of selected frequencies of incident light at said entrance surface and emission of reduced frequency light at said exit surface.

8. The solar cell of claim 7 wherein said doped semiconductor comprises a n-type semiconductor.

9. The solar cell of claim 7 wherein said doped semiconductor comprises a direct bandgap semiconductor.

10. The solar cell of claim 1, wherein the width of said indents is not less than 500 nm.

11. The solar cell of claim 10, wherein the width of said indents is in the range of 2-5 microns.

12. A multi-junction solar cell for converting light to electricity characterized by improved energy conversion performance, wherein said multi-junction solar cell includes a plurality of adjacent layers, each layer comprising
   a. a semiconductor having an entrance surface and an exit surface;
   b. a first grating formed on said entrance surface, said grating comprising a series of substantially rectangular indents and protrusions perpendicular to said entrance surface, wherein each indent has a depth $a=c/4v$, where $c$ is the velocity of light and $v$ is a first frequency of incident light hitting said entrance surface, and an indent width greater than $c/v$, the wavelength of said incident light; and
   c. a second grating formed on said exit surface comprising a series of substantially rectangular indents and protrusions perpendicular to said exit surface, wherein each indent has a depth $b=c'/4v'$, where $c'$ is the velocity of light and $v'$ is a second frequency of light emitted from said exit surface, and an indent width greater than $c'/v'$, the wavelength of said emitted light, wherein $v$ and $v'$ are different.

13. The multi-junction solar cell of claim 12, wherein said layers are positioned in said multi-junction solar cell so that emitted light from said exit surface becomes incident light on an entrance surface of an adjacent layer.

14. The multi-junction solar cell of claim 13, wherein the width of said indents is not less than 500 nm.

15. The multi-junction solar cell of claim 14, wherein the width of said indents is in the range of 2-5 microns.

16. The multi-junction solar cell of claim 12, wherein said semiconductor comprises a doped semiconductor having a band gap energy $Eg$ equal to or smaller than an energy $hv$ of said incident light, where $h$ is the Planck constant.

17. The multi-junction solar cell of claim 16, wherein said semiconductor is doped to output light of a specific desired frequency.

* * * * *